United States Patent [19]

Downs et al.

[11] Patent Number: 5,024,734
[45] Date of Patent: Jun. 18, 1991

[54] SOLDER PAD/CIRCUIT TRACE INTERFACE AND A METHOD FOR GENERATING THE SAME

[75] Inventors: Walter M. Downs, Lutherville; Michael J. Ankrom, Baltimore, both of Md.

[73] Assignee: Westinghouse Electric Corp., Pittsburgh, Pa.

[21] Appl. No.: 457,421

[22] Filed: Dec. 27, 1989

[51] Int. Cl.⁵ .................. C25D 5/02; C25D 5/48; C25D 5/10; B05D 5/12
[52] U.S. Cl. .......................... 204/15; 204/35.1; 204/40; 427/96
[58] Field of Search ............... 204/15; 427/96, 97

[56] References Cited
U.S. PATENT DOCUMENTS 3,778,530 12/1973 Reimann .................. 204/15
4,104,111 8/1978 Mack ........................ 427/97

OTHER PUBLICATIONS

Duffek, E., "PC Processing Using Solder Mask Over Tin-Nickel", Electronic Packaging and Production, Jun. 1979, pp. 71-73.

Primary Examiner—John F. Niebling
Assistant Examiner—Kishor Mayekar

[57] ABSTRACT

A circuit trace/solder pad interface for closely spaced circuit traces is presented in which solder must be deposited to form a solder pad upon the circuit trace and the solder not migrate onto the circuit trace upon solder reflow. Through the intentional selection of solderably incompatible metals for the circuit trace and the solder pad, the solder pad may be isolated from the circuit trace thereby retaining solder on the pad. Furthermore a method for fabricating this circuit trace/solder pad interface is presented.

8 Claims, 2 Drawing Sheets

SOLDER PAD/CIRCUIT TRACE INTERFACE AND A METHOD FOR GENERATING THE SAME

BACKGROUND OF THE INVENTION

This invention relates to solder deposition methods and more specifically to a method for depositing and segregating a thick pad of solder upon a relatively thin circuit trace.

Current technology, such as VHSIC (Very High Speed Integrated Circuit) technology, permits fabrication of leaded electronic devices having a 20 mil (0.020 inch) pitch between leads. It is desirable to secure these devices to a PWB (Printed Wiring Board) using soldering techniques. For an electronic device having a 20 mil pitch, the device leads are approximately 14 mils (0.014 inches) wide and the distance between adjacent leads is about 6 mils (0.006 inches). This necessitates, for compatability with the device, closely-spaced circuit traces and closely-spaced solder pads having widths and pitches of similar magnitudes. However the device leads typically are smaller than the circuit traces to which the leads are to be connected and as a consequence an amount of solder exceeding the circuit trace thickness must be added to the PWB surface at the circuit trace connection point. Depositing and maintaining this added amount of solder, as will be discussed, presents problems with solder migration and with excess solder upon circuit traces.

FIG. 1 shows an electronic device 10, such as a microprocessor or electronic chip, having a plurality of leads 12. The electronic device 10 is mounted to a PWB (printed wiring board) 14 and the leads 12 are electrically connected to the PWB 14 at a plurality of corresponding solder pads 16. Connected to each solder pad 16 is a circuit trace 18. A circuit trace 18 may be electrically connected to an electrical via 20 which penetrates the PWB to electrically connect at another location, or a circuit trace 22 may electrically connect at a location on the same surface of the PWB 14.

FIG. 2 shows a cross-section of the electronic device 10 shown in FIG. 1. Note the item numbers are the same as those found in the discussion of FIG. 1. It is seen from FIG. 2 that the circuit trace 18 extends past the solder pad 16. For future discussion an area 21 is encircled.

Note the relative thickness of the solder pad 16 to the circuit trace 18. In order to secure the electronic device lead 12 to the solder pad 16, it is necessary to heat the region surrounding the solder pad 16 to a temperature above the reflow temperature of the solder. Typically the entire PWB 14 is heated to a temperature above this reflow temperature. While this is required to reflow the solder on the solder pad, if the material of the solder pad 16 and the circuit trace 18 are solderably compatible, that is, if the solder of the pad wets the circuit trace material, then at the solder reflow temperature the solder pad 16 loses its configuration as a portion of the solder migrates along the circuit trace 18 as shown in FIG. 3 such that there may not be adequate solder to secure the lead.

If the circuit trace 18 was thick enough such that it extended to the height at which solder pad 16 extends as shown in FIG. 2, then upon reflow the configuration of the circuit trace and the area of the solder pad would not change. Under these circumstances both the circuit trace 18 and the solder pad 16 could be solderably compatible. However, because the leads from electronic devices are typically smaller than the circuit traces, in order to secure a relatively small lead from the electronic device to a relatively large circuit trace on a PWB, a minimum amount of solder is required. Typically this minimum amount of solder must be of a thickness much greater than the thickness of a typical circuit trace. For this reason in order to maintain the flexibility to design thin circuit traces and provide a thick solder deposition in the area to which a lead is to be secured, another approach must be found for the deposition of solder on a PWB for securing the lead of an electronic component.

A second problem exists when the copper circuit traces are covered with a shielding material, such as tin-lead solder, to prevent oxidation of the circuit traces, which are typically made of copper. Although not shown in FIG. 1, after the electronic component 10 is in place on the PWB, a solder mask is placed over all of the areas on the PWB 14 in which solder should not reflow. Specifically, a solder mask is secured to the PWB to cover the plurality of circuit traces 18. When the PWB is heated so that the solder will reflow, if the circuit traces 18 are shielded with the same solder that is to be reflowed, then this shielding solder over the traces also may reflow. Since the solder mask is secured to the PWB, there is pressure downward compressing the circuit traces and solder shielding such that upon reflow, the solder shielding is compressed and loses shape as the solder deposits over the circuit traces begin to flatten and widen across the PWB. As mentioned before, the spacing between the circuit traces may be fairly small. The shielding solder over the closely spaced circuit traces 18 may be sufficiently deformed such that adjacent circuit traces electrically contact one another and form an electrical short, which is clearly unacceptable.

It is therefore an object of this invention to provide a solder deposition method and a circuit trace/solder pad interface that does not permit solder on a given solder pad to migrate along the associated circuit trace.

It is another object of this invention to provide a solder deposition method and a circuit trace/solder pad interface where the circuit traces do not reflow and lose their configuration such that short circuits with adjacent circuit traces are possible.

It is still another object of this invention to provide a method and a circuit trace/solder pad interface so that adequate solder may be deposited upon solder pads which are electrically connected to adjacent circuit traces such that after solder reflow there will be adequate amounts of solder to ensure that the leads of electronic components will be properly bonded at the solder pad.

SUMMARY OF THE INVENTION

A method is disclosed and an interface fabricated utilizing the method, of precisely depositing, upon a PWB, closely-spaced circuit traces and closely-spaced solder pads which are electrically connected to the traces and of a greater thickness than the traces such that during a solder reflow operation the solder will not migrate from the pad onto the circuit traces, the method comprising the steps of first depositing circuit traces of a single component metal having a melting point greater than that of the solder and which is poorly wettable to the solder, upon a conductive base layer on a dielectric substrate with a portion of each trace overlapping an area on the base layer onto which a solder pad for the lead of an electrical component is to be located. After this the overlapping portion of the metal circuit trace is activated and an intermediate layer of metal is deposited, the metal of which is wettable to both the trace metal and the solder, within the pad area at least upon the overlapping portion of the metal circuit trace. Solder is then deposited over the intermediate layer of metal to a predetermined thickness greater than the thickness of the circuit trace. Finally portions of the conductive base layer adjacent to the circuit traces are selectively removed such that the circuit traces are no longer electrically interconnected by the base layer.

DESCRIPTION OF THE PREFERRED EMBODIMENT

Figure 4:
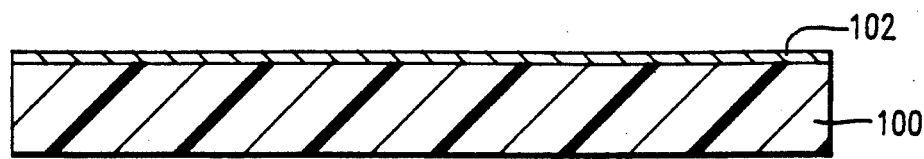
FIGS. 4-8 illustrate a series of steps in the fabrication of the solder/circuit trace interface described in this invention.
Figure 5:
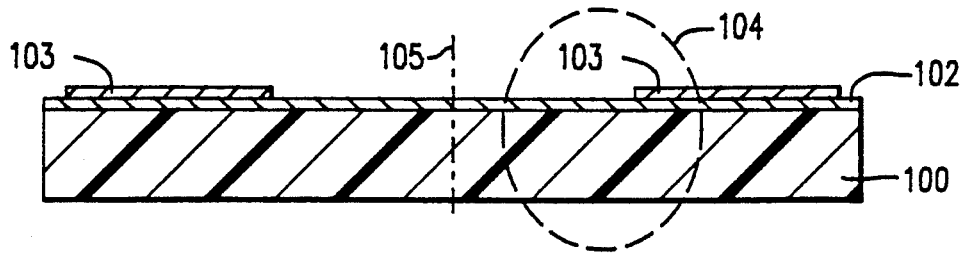

FIG. 4 shows a substrate 100 having upon a surface a layer 102 of a conductive material such as copper. The base layer 102 of conductive material has a thickness of approximately 1 mil (0.001 inches). This base layer 102 serves as a foundation layer upon which electrolytical deposition of circuitry may be made. In lieu of depositing a base layer, commercially available sheets of copper clad laminate may be used to serve this purpose. A plurality of circuit traces 103 are deposited upon layer 102 as shown in FIG. 5. These traces may be similar to those seen in FIG. 1 and identified as item 18. For comparison the encircled area indicated by 104 in FIGS. 5-8 is comparable to that indicated by 21 in FIG. 2. Furthermore in FIGS. 5-8, the area 104 is symmetrical about the axis 105 and because of this, the solder/circuit trace interface discussed will be applicable to the configuration on either side of line 105 of each FIG. 5-8.

Note that technically a metal deposition, such as tin-lead, becomes solder only after the deposition has reached reflow temperature. However, this is a subtle distinction and not critical to the invention described herein. For that reason throughout this application a deposition that becomes solder upon reflow will be referred to, before and after reflow, as solder.

Returning to FIG. 5, upon the base layer will be deposited circuit traces, as shown, and solder pads. A preferred method of deposition for both circuit traces and solder pads is through the electrolytical deposition process of electroplating. Note, however, that electroless deposition processes are also available and may be used for the deposition of circuit traces and solder pads in this invention.

Briefly stating one possible sequence of steps for electrolytical deposition, which are well known to one skilled in the art of metal deposition, a layer of photoimagable resist is placed over layer 102 and upon this resist is placed a pattern, or photo tool, which defines the circuit traces 103 to be deposited upon layer 102. The resist is then exposed to light for a period of time such that the portion exposed to light does not cure while the remaining portion does cure. The pattern is then removed and the uncured resist, which is soft, is removed thereby providing a template over layer 102 which defines by cavities within the resist the pattern of circuit traces to be deposited. The process of electroplating is then executed and metal is deposited in the appropriate pattern upon layer 102 thereby defining the circuit traces 103. The art of electroplating is well known and will not be further described.

Figure 3:
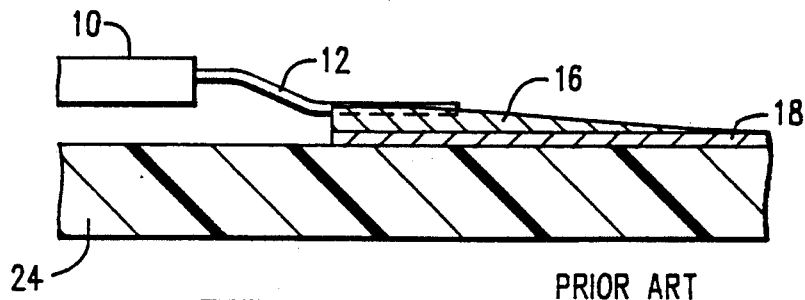
FIG. 3 illustrates the configuration in FIG. 2 after the PWB has been heated above the reflow temperature of the solder on the solder pads. This is also prior art.

The selection of metal used for the circuit trace 103 is critical. It is imperative that the metal for the circuit trace 103 has a higher melting point than that of the solder to be selected for the solder pads and also that the metal of the circuit trace 103 not be solderably compatible with the solder of the solder pad. Specifically the solder must not be capable of wetting to the circuit trace 103 during the reflow operation. Wetting is the specific interaction that takes place between the liquid solder and the solid surface of the part to be soldered. If this did occur, then the same problem of solder migration discussed with FIG. 3 would be present. This is avoided by the selection of circuit trace metal that will not form an intermetallic bond with the solder. Such a metal must have a higher melting point than that of the solder and at the same time must be compatible for use as a circuit trace.

A preferred metal for the circuit trace is nickel. However, this is only preferred when the solder is a tin-lead alloy. A preferable tin-lead solder has a combination of 63% by weight of tin and 37% by weight of lead. The incompatibility of the metal of the circuit trace with the metal alloy used for the solder is critical to avoid the migration of the solder from the solder pad onto the circuit trace 103. Since the metal of the circuit trace 103 and the solder pad are selected because they are solderably incompatible, then it will be necessary to provide an intermediate layer that will be compatible to both of these metals.

Tin-lead solder is the most commonly used solder for PWB fabrication technology and other circuit trace metal must be selected with this in mind. Other metals that may be utilized for circuit traces comprise gold, silver and palladium.

Figure 6:
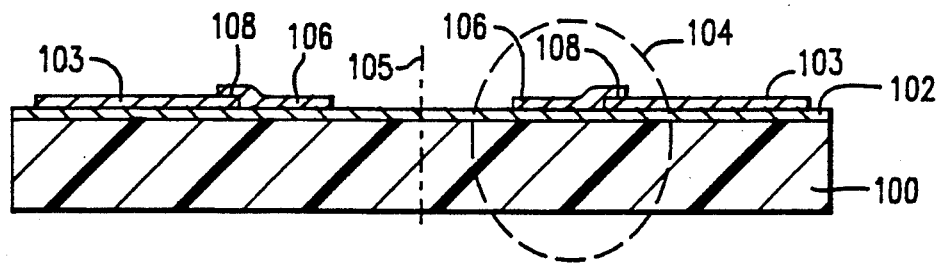

FIG. 6 shows the first step in the fabrication of a solder pad upon the PWB. Layers 102 and 103 are covered with photoresist and a pattern defining the areas over the substrate 100 upon which an intermediate layer is to be deposited. The purpose of the intermediate layer is to provide a metal that will be solderably compatible with both the circuit trace material and the solder of the solder pad. For that reason the intermediate material must cover at least the portion of the circuit trace which overlaps the solder pad area since it is this area upon which the solder will be deposited. While it is not necessary for the intermediate layer to extend beyond the circuit trace surface within the solder pad area, for convenience, the intermediate layer may extend past the overlap region and over the solder pad area. This permits using the same pattern for depositing the intermediate layer and for depositing the solder for the solder pad.

Once the photoresist is applied and the pattern is in place over layer 102 and 103, the photoresist is photoimaged and processed. The uncured portion of the photoresist is removed to provide a cavity for metal deposition thereby permitting electrolytical deposition of the intermediate layer 106. A layer 106 of the metal is deposited upon layer 102 with a slight overlap 108 onto the circuit trace 103. Note in FIG. 6 the intermediate layer has been deposited over the entire solder pad area.

Just as with the deposition of circuit trace 103, a preferred method of depositing the intermediate layer 106 is through a process of electroplating. Furthermore, a preferred material for the intermediate layer 106 is copper which may be deposited to a thickness of approximately 0.3 mils (0.0003 inches). This type of layer is frequently referred to as a flash layer. Note the cavities defined by the photoresist are still in place.

During this deposition process it is important for the pattern which is placed over the photoresist to be properly registered to provide proper deposition of layer 106. It is necessary for layer 106 to overlap with layer 103 to ensure contact with layer 103.

Just as the circuit trace 103 does not wet with solder it may also not wet with the intermediate layer 106. To improve compatibility it may be necessary prior to the deposition of the intermediate layer 106 to treat that portion 108 of the circuit trace 103 upon which the intermediate layer 106 overlaps. This treating to remove oxidation on the circuit trace surface may be done through a process of chemical activation. A typical chemical that may be used for this chemical activation process is sulfuric acid. Absent this process it is possible that the intermediate layer 106 and the circuit trace 103 would be in contact but electrically insulated by an oxide layer.

Once the intermediate layer 106 has been deposited upon the circuit trace 103 and the base layer 102 as shown in FIG. 6, it is possible to deposit the solder to form the solder pads. Upon the intermediate layer 106 is deposited a layer 110 of solder. As mentioned earlier, if the intermediate layer 106 has been deposited over the entire surface area of the solder pad, then solder may be deposited directly within the cavities already defined by the photoresist. If the intermediate layer has only been deposited upon the overlap region, then additional photoresist steps would be necessary to remove the old photoresist and apply a new pattern to create cavities that are large enough to permit metal deposition over the solder pad region.

The manner of deposition again involves exposing to light photoresist selectively shielded, removing the photoresist in unexposed regions to create cavities and electrolytically depositing metal within the newly created cavities is similar to deposition steps already described. The method is similar to that described in the deposition of the other layers. Note the relative thickness of the solder pad 110 to the circuit trace 103. Preferably the thickness of the solder pad 110 is approximately three time greater than that of the circuit trace. A typical circuit trace would be 1.4 mils (0.0014 inches) thick while a typical solder pad would be approximately 4.7 mils (0.0047 inches) thick.

Figure 7:
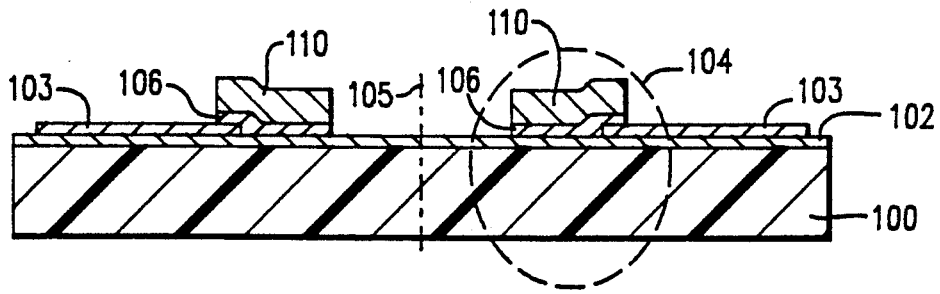

While not to an exact scale FIG. 7 does illustrate that the solder pad 110 is significantly thicker than the circuit trace 103 and if the two were solderably compatible, upon heating the solder to the reflow temperature the solder would tend to migrate onto the circuit traces 103 thereby diminishing the amount of solder 110 on the pad.

In the current configuration shown in FIG. 7 the solder 110 while isolated by the thin intermediate layer 106 upon reflow will still contact the circuit trace 103. However through the selection of a solder for the solder pad and a metal that is not solderably compatible with the solder, i.e. that does not wet with the solder, the solder 110 at reflow temperatures will not wet to the circuit trace 103. Because of this the solder will essentially be isolated within the region already defined for the solder pad.

Note that through FIGS. 4-7 layer 102 has been present. For any electrolytical deposition process to be successful it is necessary for an entire surface to act as an electrode to receive metal and as such the entire surface must be electrically connected. Once the electrolytical deposition process has been completed then there is no longer a necessity for layer 102. Furthermore to provide distinct and separate circuit traces layer 102 must be selectively removed. Since portions of layer 102 which are beneath the circuit traces 103 and the solder pad 110, it is not necessary to remove those portions.

In one preferred embodiment the circuit traces are nickel, the solder pad is tin-lead solder and the base layer 102 is copper. Under theses circumstances, an etchant may be provided to selectively attack only the copper and it will not be necessary to shield the other metals. In this manner the circuit traces 103 and the solder pad 110 will be unaffected by the etching process. Note that intermediate layer 106 will be partially removed, however, the portion removed will be around the perimeter of the solder pad and this will not significantly effect the contact of the solder pad 110 to the circuit traces 103.

Figure 8:
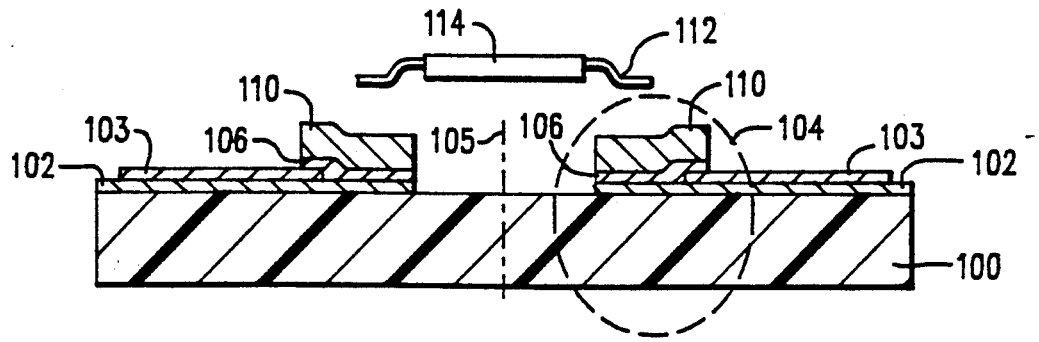

If the circuit traces or solder layer are of metals that will also be effected by the etchant used for the base layer, then it will be necessary to shield the circuit traces and the solder pads during the etching process. Just as metal was selectively deposited by creating cavities within photoresist and depositing metal within these cavities, in a reverse manner, portions of layer 102 may be selectively removed. By providing a pattern over the surface of the PWB which covers all of the metal associated with circuit traces and the solder pads, then an etchant may be applied to the PWB to selectively remove portions of layer 102 as shown in FIG. 8.

The solder pads 110 that have now been deposited form pads upon which the leads 112 of an electronic component 114 may be placed. When the PWB is subjected to heat and the solder pads reach a temperature above their reflow temperature then the leads 112 will become bonded to the solder pad 106. Since the solder of the solder pad 106 will not migrate to the circuit traces 103, then there will be adequate solder remaining in the solder pad 106 to encompass the lead 112 thereby permitting a quality solder bond between the lead and the circuit traces 103.

During the soldering procedure, the solder may be purified by heating it to reflow temperatures before the leads 112 are secured. While it is possible to forego this step, the step results in a better bond and is therefore recommended prior to securing the leads 112 to the circuit traces through the solder.

Figure 1:
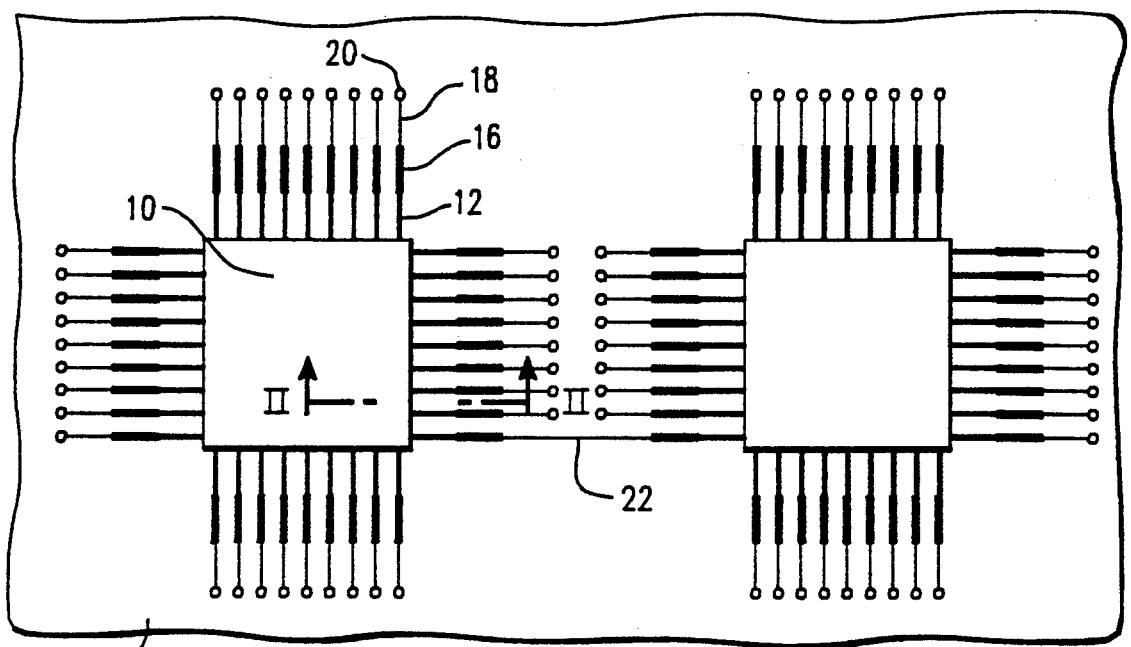
FIG. 1 is prior art and shows a portion of a PWB with electronic devices mounted upon it.
Figure 2:
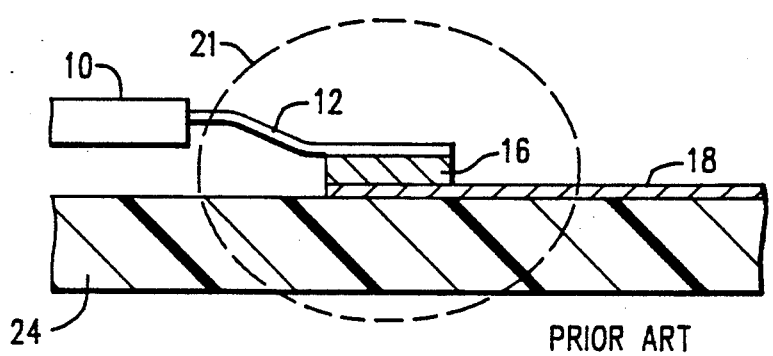
FIG. 2 shows a cross-section of FIG. 1 highlighting the point of attachment of a lead from an electronic device to a circuit trace on a PWB. This is prior art.

Note that FIG. 1 shows an electrical via through a hole 20 extending through the PWB 14. Without a restriction that the circuit trace metal be solderably compatible with the solder of the solder pad, then an added benefit to the selection of metal for the circuit trace 103 in FIGS. 5-8 is that the metal may be selected for its mechanical properties largely independent of its compatibility with solder. In this way the material for the circuit trace 103 may be selected to provide low resistivity and a relatively high strength. This not only enhances the circuit traces 103 but if the PWB also has electrical vias connected to the circuit traces then the electroplating process may be extended through these electrical vias thereby providing strength not only in the circuit traces 103 but simultaneously providing strength to the electrical vias. Mechanical strength through the electrical vias is important because the PWB, since it contains a variety of metal traces and solder pads each having a different mass, does not heat up uniformly. For this reason thermal stresses are an important factor in the design of a PWB and by providing the increased mechanical strength of the circuit trace material for the electrical vias it is possible to provide the electrical vias with a higher mechanical strength thereby enabling the vias to withstand thermal stresses more effectively.

Although this invention has been described with reference to a specific embodiment thereof, numerous modifications are possible without departing from the invention, and it is desirable to cover all modifications falling within the spirit and scope of this invention.

What is claimed is:

1. A method of precisely depositing, upon a PWB, closely-spaced circuit traces and closely-spaced solder pads which are electrically connected to the traces and of a greater thickness than the traces such that during a solder reflow operation the solder will not migrate from the pad onto the circuit traces, the method comprising the steps of:
    a) depositing circuit traces of a single component metal of nickel having a melting point greater than that of the solder and which is poorly wettable to the solder upon a conductive base layer on a dielectric substrate with a portion of each trace overlapping an area on the base layer onto which a solder pad for the lead of an electrical component is to be located;
    b) activating the overlapping portion of each metal circuit trace;
    c) depositing an intermediate layer of metal, which is wettable to both the trace metal and the solder, within the pad area at least upon the overlapping portion of each metal circuit trace;
    d) depositing solder over each intermediate layer of metal to a predetermined thickness greater than the thickness of the circuit trace and;
    e) selectively removing portions of the conductive base layer adjacent to the circuit traces such that the circuit traces are not electrically interconnected by the base layer.

2. The method according to claim 1 wherein the steps of deposition are performed through a process of electroplating.

3. The method according to claim 2 wherein the step of depositing circuit traces comprises depositing circuit traces of nickel, the step of depositing an intermediate layer of metal comprises depositing an intermediate layer of copper and the step of depositing solder comprises depositing tin-lead solder.

4. The method according to claim 3 wherein the step of depositing solder over the pad area comprises depositing a predetermined thickness which is at least three times greater than that of the circuit trace thickness.

5. The method according to claim 4 wherein the step of depositing circuit traces comprises depositing circuit traces to a thickness of approximately 1.4 mils (0.0014 inches), the step of depositing an intermediate layer of metal comprises depositing a layer to a thickness of approximately 0.3 mils (0.0003 inches) and the step of depositing solder comprises depositing a layer of solder to a thickness of approximately 4.7 mils (0.0047 inches).

6. The method according to claim 2 wherein the step of activating the overlapping portion comprises chemically activating the overlapping portion.

7. The method according to claim 6 wherein the step of selectively removing portions of the conductive base layer comprises chemically etching the base layer at selected portions.

8. A method of precisely depositing, upon a PWB, closely-spaced circuit traces and closely-spaced solder pads which are electrically connected to the traces and of a greater thickness than the traces such that during a solder reflow operation the solder will not migrate from the pad onto the circuit traces, the method comprising the steps of:
    a) depositing circuit traces of nickel, which has a higher melting point than the solder and which is poorly wettable to the solder, upon a conductive base layer on a dielectric substrate with a portion of each trace overlapping an area onto which a solder pad for the lead of an electrical component is to be located;
    b) chemically activating the overlapping portion of each metal circuit trace;
    c) depositing an intermediate layer of copper, which is wettable to both the trace metal and the solder, within the pad area at least upon the overlapping portion of each metal circuit trace and
    d) depositing tin-lead solder over each pad area to a predetermined thickness at least three times greater than the thickness of the circuit trace and;
    e) selectively removing portions of the conductive base layer adjacent to each circuit traces such that the circuit traces are not electrically interconnected by the base layer.

* * * * *